(12) United States Patent
Mostafavi et al.

(10) Patent No.: US 11,163,017 B2
(45) Date of Patent: Nov. 2, 2021

(54) OPTICAL MONITORING TO DETECT CONTAMINATION OF POWER GRID COMPONENTS

(71) Applicant: Palo Alto Research Center Incorporated, Palo Alto, CA (US)

(72) Inventors: Saman Mostafavi, Charlotte, NC (US); Hong Yu, Fremont, CA (US); Ajay Raghavan, Mountain View, CA (US); Peter Kiesel, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 222 days.

(21) Appl. No.: 16/662,655

(22) Filed: Oct. 24, 2019

(65) Prior Publication Data

US 2021/0123964 A1   Apr. 29, 2021

(51) Int. Cl.
*G01R 29/20* (2006.01)
*G01R 31/62* (2020.01)
(Continued)

(52) U.S. Cl.
CPC ............ *G01R 31/62* (2020.01); *G01J 3/1895* (2013.01); *G01L 1/246* (2013.01); *G01N 17/00* (2013.01);
(Continued)

(58) Field of Classification Search
CPC ........ G01R 31/62; G01R 29/20; G01R 35/02; G01R 31/72; G01R 31/52; G01R 1/28; G01R 31/346; G01R 15/207; G01R 19/2513; G01J 3/1895; G01L 1/246; H01F 27/08; H01F 27/02; H01F 2027/406; H01F 27/402; H04B 3/46; G01N 17/00
(Continued)

(56) References Cited

U.S. PATENT DOCUMENTS 5,499,313 A   3/1996 Kleinerman
7,845,404 B2   12/2010 McStay et al.
(Continued)

FOREIGN PATENT DOCUMENTS

CN   201892586 U   7/2011
CN   202221693 U   6/2012
(Continued)

OTHER PUBLICATIONS

Hegyi et al., "Time- and Wavelength-Multiplexed Wavelength Shift Detection for High-Resolution, Low-Cost Distributed Fiber-Optic Sensing," J. Lightwave Technol. 35, 2017, pp. 4234-4241.
(Continued)

*Primary Examiner* — Raul J Rios Russo
(74) *Attorney, Agent, or Firm* — Mueting Raasch Group

(57) ABSTRACT

A monitoring system includes an array of optical sensors disposed within a transformer tank. Each optical sensor is configured to have an optical output that changes in response to a temperature within the transformer tank. An analyzer is coupled to the array of optical sensors. The analyzer is configured to determine a sensed temperature distribution based on the sensed temperature. The sensed temperature distribution is compared to an expected distribution. Exterior contamination of the transformer tank is detected based on the comparison.

20 Claims, 10 Drawing Sheets

(51) Int. Cl.
| | |
|---|---|
| *G01J 3/18* | (2006.01) |
| *G01L 1/24* | (2006.01) |
| *H01F 27/08* | (2006.01) |
| *H04B 3/46* | (2015.01) |
| *G01N 17/00* | (2006.01) |
| *H01F 27/02* | (2006.01) |
| *G01R 19/25* | (2006.01) |
| *G01R 35/02* | (2006.01) |
| *G01R 31/72* | (2020.01) |
| *G01R 31/52* | (2020.01) |
| *G01R 1/28* | (2006.01) |
| *G01R 31/34* | (2020.01) |
| *G01R 15/20* | (2006.01) |

(52) U.S. Cl.
CPC ........... *G01R 1/28* (2013.01); *G01R 19/2513* (2013.01); *G01R 29/20* (2013.01); *G01R 31/52* (2020.01); *G01R 31/72* (2020.01); *G01R 35/02* (2013.01); *H01F 27/02* (2013.01); *H01F 27/08* (2013.01); *H04B 3/46* (2013.01); *G01R 15/207* (2013.01); *G01R 31/346* (2013.01)

(58) Field of Classification Search
USPC ............. 324/74, 76.11–76.83, 459, 600, 726
See application file for complete search history.

(56) References Cited

U.S. PATENT DOCUMENTS

| | | | |
|---|---|---|---|
| 9,664,609 | B2 | 5/2017 | Magne et al. |
| 10,895,566 | B1* | 1/2021 | Teepe ..................... G01D 5/268 |
| 2006/0151191 | A1 | 7/2006 | Hosokawa et al. |
| 2017/0356870 | A1 | 12/2017 | Doany et al. |
| 2017/0363805 | A1 | 12/2017 | Iwakawa |
| 2019/0011491 | A1 | 1/2019 | Raghavan et al. |
| 2019/0317130 | A1 | 10/2019 | Sun et al. |
| 2021/0123775 | A1* | 4/2021 | Kiesel ................ G01D 5/35312 |
| 2021/0123797 | A1* | 4/2021 | Kiesel .................... H01F 27/14 |

FOREIGN PATENT DOCUMENTS

| | | |
|---|---|---|
| CN | 101949744 B | 8/2012 |
| CN | 108151910 A | 6/2018 |
| EP | 0646304 B1 | 5/1999 |

OTHER PUBLICATIONS

Hoffman et al., "The No-U-turn sampler: adaptively setting path lengths in Hamiltonian Monte Carlo." Journal of Machine Learning Research 15.1, 2014, pp. 1593-1623.

Lisowska-Lis, "Thermographic monitoring of the power transformers." Measurement Automation Monitoring 63, 2017.

Utami et al. "Evaluation condition of transformer based on Infrared thermography results." Properties and Applications of Dielectric Materials, 2009, IEEE 9th International Conference on the. IEEE, 2009.

* cited by examiner

OPTICAL MONITORING TO DETECT CONTAMINATION OF POWER GRID COMPONENTS

STATEMENT REGARDING FEDERALLY SPONSORED RESEARCH AND DEVELOPMENT

This invention is based on work supported by the U.S. Department of Energy (DOE)/Office of Electricity through the DOE National Energy Technology Laboratory under award agreement #DE-OE0000872. The Government has certain rights to this invention.

TECHNICAL FIELD

This application relates generally to techniques for optically monitoring power grid transmission and distribution systems. The application also relates to components, devices, systems, and methods pertaining to such techniques.

BACKGROUND

Global climate change and population growth are driving increased demands for reliable, sustainable, and clean electricity around the world. This is creating an even heavier burden on the already overstressed and aging global power infrastructure. Modern power grids are complex, tightly interconnected systems. Certain extraneous conditions at key locations can have unpredictable and immediate impacts over a wide area. The existing power grid suffers from a lack of effective distributed communications, monitoring, fault diagnostics, and automation, which further increase the possibility of wide-area breakdown due to cascading effects from a single fault.

SUMMARY

Embodiments described herein involve a monitoring system comprising an array of optical sensors disposed within a transformer tank. Each optical sensor is configured to have an optical output that changes in response to a temperature within the transformer tank. An analyzer is coupled to the array of optical sensors. The analyzer is configured to determine a sensed temperature distribution based on the sensed temperature. The sensed temperature distribution is compared to an expected distribution. Exterior contamination of the transformer tank is detected based on the comparison.

A method involves sensing a plurality of temperature values using an array of optical sensors disposed within a transformer tank. A sensed temperature distribution is determined based on the sensed temperatures. The sensed temperature distribution is compared to an expected distribution. Exterior contamination of the transformer tank is detected based on the comparison.

The above summary is not intended to describe each embodiment or every implementation. A more complete understanding will become apparent and appreciated by referring to the following detailed description and claims in conjunction with the accompanying drawings.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
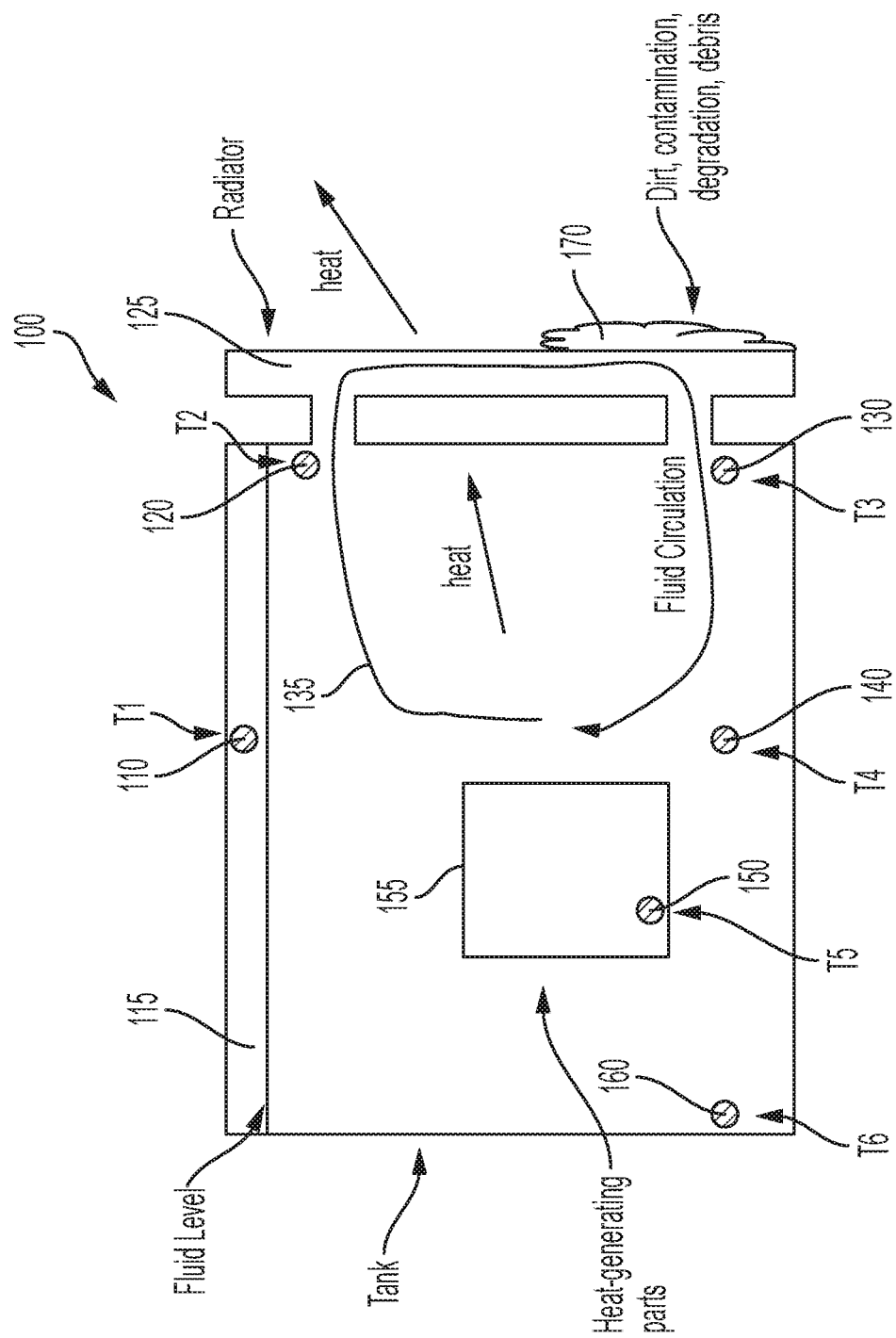
FIGS. 1A and 1B illustrate transformer tanks having a plurality of sensors in accordance with embodiments described herein.

Fluid-filled grid assets such as transformers are used across the electrical grid. The fluid may be oil and/or ester, for example. The fluid is used both for its dielectric strength (to allow a more compact build) and for its heat transfer ability. The heat transfer is used to keep the working electrical features at a lower temperature by providing thermal conductivity to the exterior tank wall. The heat is dissipated into the surrounding fluid and transferred to the tank and radiator walls in two ways: 1) direct heat conduction through the liquid; and 2) heat convection between the circulated fluid and tank walls. The heat is then dissipated into environment through the highly emissive radiator surface, via radiation and convection. Often a "radiator" element can be used in order to increase the heat transfer rate from the tank to the environment.

Heat transfer to the environment may be impeded in multiple ways. The exterior wall of the asset may be designed/painted with a material with a high emissivity and corrosion resistance. The high emissivity material increases the heat transfer rate from the tank to the environment. If this material is corroded or contaminated, the heat transfer rate is lowered. This will also affect the fluid circulation rate and in turn change the temperature distribution trends inside the tank. Thus, by measuring a fine gradient of temperature points inside the asset, it is possible to detect soiling, degradation or debris on the outside of the asset. Thermography may be used as a sensing methodology through infrared sensors for monitoring temperatures due to most direct sensing methods being either too costly or simply unable to withstand the harsh environments of transformer tanks, for example. Techniques using thermography they tend to focus primarily on the issues involving the deteriorated electrical insulation and not those of the exterior wall's degradation. While thermography may provide invaluable insight on the thermal conditions inside a tank transformer, it is not suitable for continuous monitoring purposes that exterior surface monitoring applications use.

A high percentage of network transformer failures are due to corrosion and/or other contamination of the transformer tank. The degree of corrosion and/or contamination taking place is also difficult to quantify by visual inspection making predictive failure difficult. Exterior contamination can be highly destructive and dangerous to the transformer's health, especially for assets in underground vaults. Typically, these vaults are concrete pits underneath a city and/or town street with a grate on a sidewalk or roadway where the grate is flushed regularly from the city street. Since these flushing events introduce significant amounts of corrosive materials to the exterior of the tank, it may be desirable to monitor the degree of soiling, contamination and/or debris on the outside of the asset.

Currently, exterior contamination may not be directly measured. In the harsh exterior environments where external corrosion and debris accumulation is inevitable, exterior sensors may have a low chance of survival for extended periods of time. To account for this, if an electrical asset is flagged for inspection, operators may clean the exterior of the asset during the visit. Embodiments described herein provide a means to remotely monitor the amount of contamination and/or corrosion occurring in the transformer vault in real time so that action can be taken before a major failure occurs.

According to embodiments described herein, an array of temperature sensors using fiber Bragg gratings (FBGs) are disposed inside the transformer tank in order to estimate external corrosion, contamination, and/or debris accumulation. Because of their relative cheap price tag, high sensitivity, and flexibility, FBGs are gaining more and more popularity for a variety of sensing purposes. Recent studies demonstrate their potential in handling data collection for condition monitoring tasks in places where conventional sensing methods are either not effective or very expensive to install.

FIG. 1A illustrates a transformer tank 100 having a plurality of sensors 110, 120, 130, 140, 150, 160 in accordance with embodiments described herein. The sensors 110, 120, 130, 140, 150, 160 can be used to measure a heat distribution inside the transformer tank 100. The measured heat distribution may be used to determine the efficacy of convective heat transfer. If it is determined that the heat transfer efficacy has dropped from a previous measurement, it may be determined that there is external debris accumulation and/or corrosion 170 on the outside of the transformer tank 100. FIG. 1A shows multiple temperature measurement points T1-T6 110, 120, 130, 140, 150, 160. A tank of fluid that is heated nonuniformly will show convective fluid circulation due to the dependence of fluid density on temperature. For example, if a radiator 125 is included in the tank design, fluid will heat up as it passes by the heat-generating element and cool off as it passes down through the radiator. Thus, a temperature difference will be generated between the different sensing points (It is important to note that even if there is no radiator included in the structure, the plain exterior tank wall or other features may effectively work the same way). As an example, if the amount of heat lost in the radiator decreases due to contamination, it is expected that the temperature difference between T2 120 and T3 130 will decrease. If temperature sensors are placed in various spots all across the tank, the deviations of their trends over time can be used in training a model to estimate the amount of contamination and/or surface degradation. This model is trained on historical data and its aim is to distinguish different sets of measurements from each other.

Figure 1B:
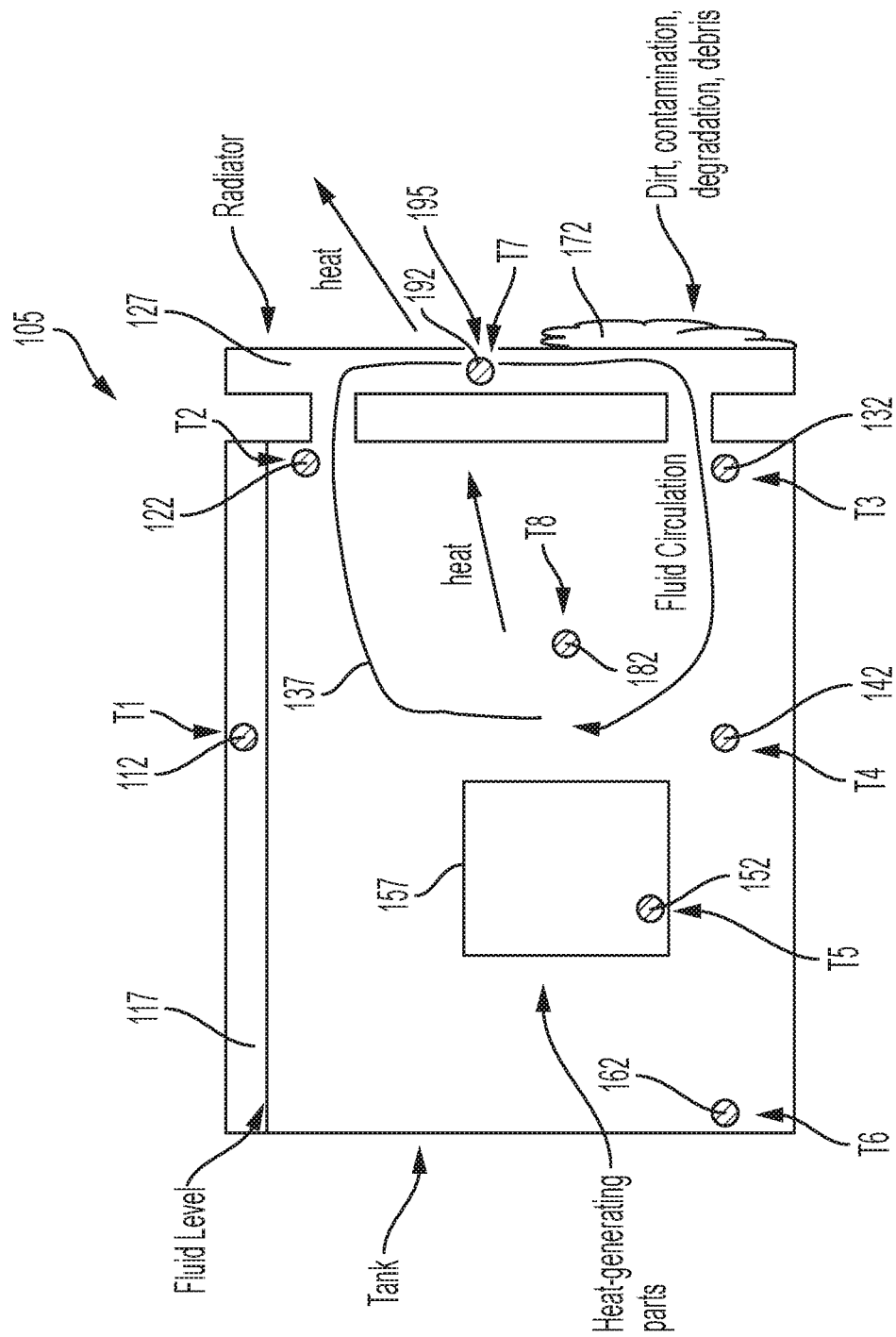

FIG. 1B shows an example transformer tank 105 having a plurality of sensors 112, 122, 132, 142, 152, 162, 182, 192 in accordance with embodiments described herein. In addition to the sensor locations shown in FIG. 1B, FIG. 1B has two additional sensor locations (T7 192 and T8 182). Here, the transformer includes a radiator and T7 192 is located close to the radiator inlet 195. While particular locations for measuring temperature are shown in FIGS. 1A and 1B, it is to be understood that different locations and/or a different number of sensors may be used.

According to embodiments described herein, when the transformer is newly installed, there is little or no external contamination or debris. By measuring the typical temperature distribution, the typical thermal loss rate can be measured in the base case where the transformer is working as new. Over time, debris may accumulate and trending the data can give a measure of the amount of debris accumulation. Once the thermal loss rate reaches a predetermined threshold, a maintenance could be scheduled.

According to embodiments described herein, debris accumulation on transformer tanks disposed in certain locations (e.g. for an asset underneath a sidewalk) may accumulate more corrosive debris than for transformer tanks disposed in locations where debris may accumulate at a comparatively slower rate. In this case, it may be desirable to have a lower predetermined threshold.

According to embodiments described herein, the thermal loss rate of the asset is determined by measuring thermal generation (via an external measure of the power dissipated by the system) and the time-dependence of multiple temperature sensors in the asset. Given a known thermal generation rate and known exterior weather (exterior temperature, presence or rain, wind speed, etc.) it is possible to predict the thermal loss rate of the transformer. The predicted thermal loss rate can be compared with the time-dependence measured at the temperature sensors in order to determine how much external debris accumulation/corrosion has occurred. According to embodiments described herein, the data collected from the sensors may be used in conjunction with multi-physics modeling of the asset's operation in order to make a more precise prediction of heat transfer fluxes.

According to embodiments described herein, one or more of the sensors comprise FBGs. Temperature changes may affect both the refractive index of the optical fiber (temperature dependence of refractive index) and/or the grating pitch (thermal expansion of fiber). According to embodiments described herein, the refractive index changes due to the strain-optics effect. The induced Bragg wavelength shift, $$\frac{\Delta \lambda}{\lambda_0},$$

caused by temperature and strain influences can be summarized as shown in (1).

$$\frac{\Delta \lambda}{\lambda_0} = (1 - p_e) \times \epsilon + (\alpha_{\{\Lambda\}} - \alpha_{\{n\}}) \times \Delta T \quad (1)$$

Here, $p_e$ represents the strain optic coefficient, $\epsilon$ represents the applied strain, $\alpha_{\{\Lambda\}}$ represents the thermal expansion coefficient of the optical fiber, $\alpha_{\{n\}}$ represents the thermo-optic coefficient, and $\Delta T$ represents the change in temperature.

Figure 2:
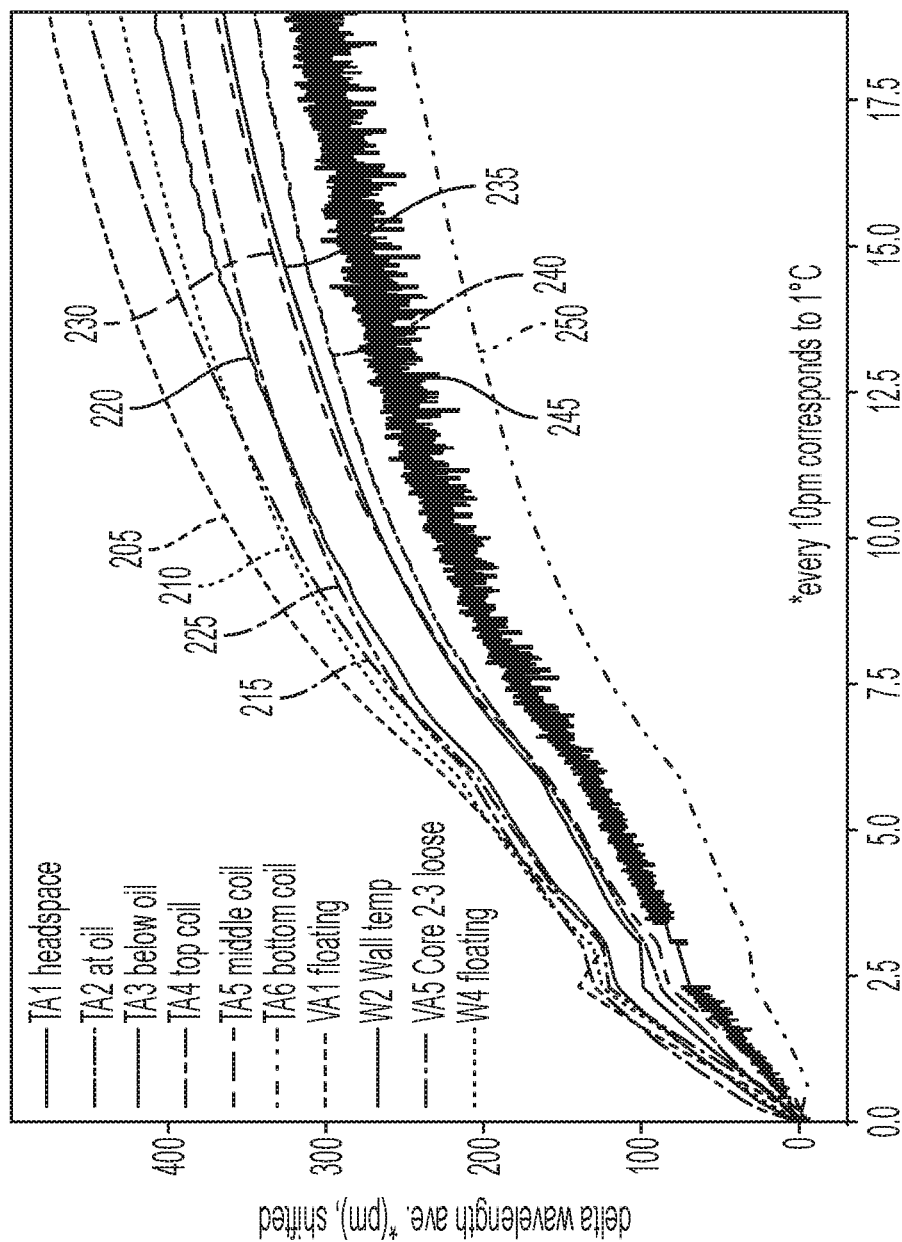
FIG. 2 demonstrates the wavelength shift for the array of sensors inside the transformer tank in accordance with embodiments described herein.

According to embodiments described herein, temperature shift is a low frequency event. With few assumptions one can relate the trend of wavelength shift to that of temperature change. FIG. 2 demonstrates the wavelength shift for the array of sensors inside the transformer tank. Here, the wavelength shift for T1 245, T2 240, T3 225, T4 220, T5 230, and T6 250 are shown. In this setup, every 10 μm of wavelength shift would roughly relate to 1° of change in temperature. According to embodiments described herein, a decoupling of the effects of thermal expansion and long term strain from temperature shift is done.

Figure 3:
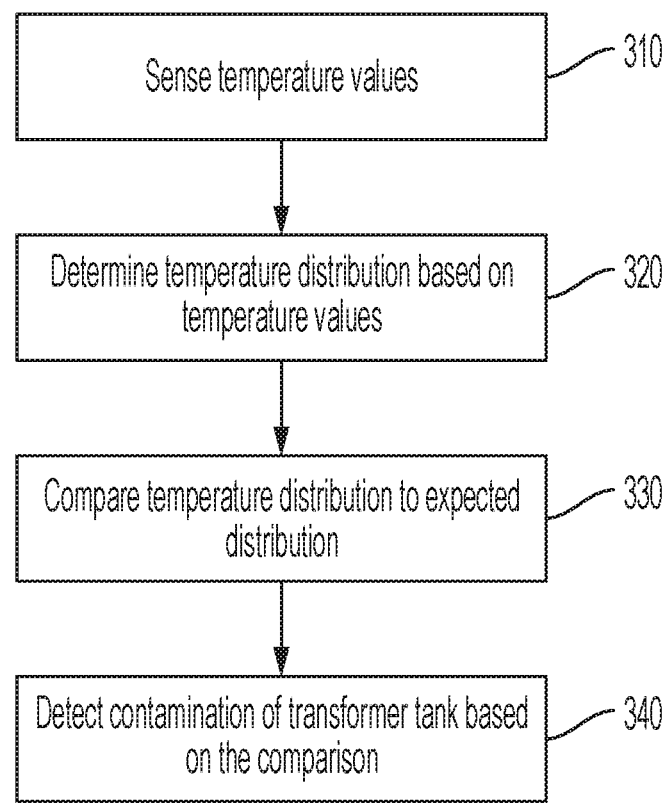
FIG. 3 shows a process for detecting contamination of a transformer tank in accordance with embodiments described herein.

FIG. 3 shows a process for detecting contamination of a transformer tank in accordance with embodiments described herein. A plurality of temperature values are sensed 310 using an array of optical sensors disposed within a transformer tank. According to embodiments described herein, each optical sensor of the array of optical sensors is disposed in a different location within the transformer tank. In some implementations, more than one sensor is disposed in at least one of the locations of the transformer tank. According to embodiments described herein, one or more of the sensed temperature values are sensed continuously. For example, one or more of the sensed temperature values may be monitored.

A sensed temperature distribution is determined 320 based on the sensed temperatures. The sensed temperature distribution is compared 330 to an expected distribution. According to embodiments described herein, the expected temperature distribution is determined based on a previously determined temperature distribution of the transformer tank. For example, the expected temperature distribution may be determined based on a first determined temperature distribution of the transformer tank. In some configurations, a default expected temperature distribution is used for more than one transformer tank. In some configurations, the expected temperature distributions for each transformer tank is determined separately.

Exterior contamination of the transformer tank is detected 340 based on the comparison. According to embodiments described herein, exterior contamination includes one or more of soiling, degradation, and debris disposed on the transformer tank. According to various embodiments, detecting exterior contamination comprises detecting corrosion of the transformer tank. In some embodiments, degradation of transformer components other than the transformer tank is detected based on the comparison.

Figure 4:
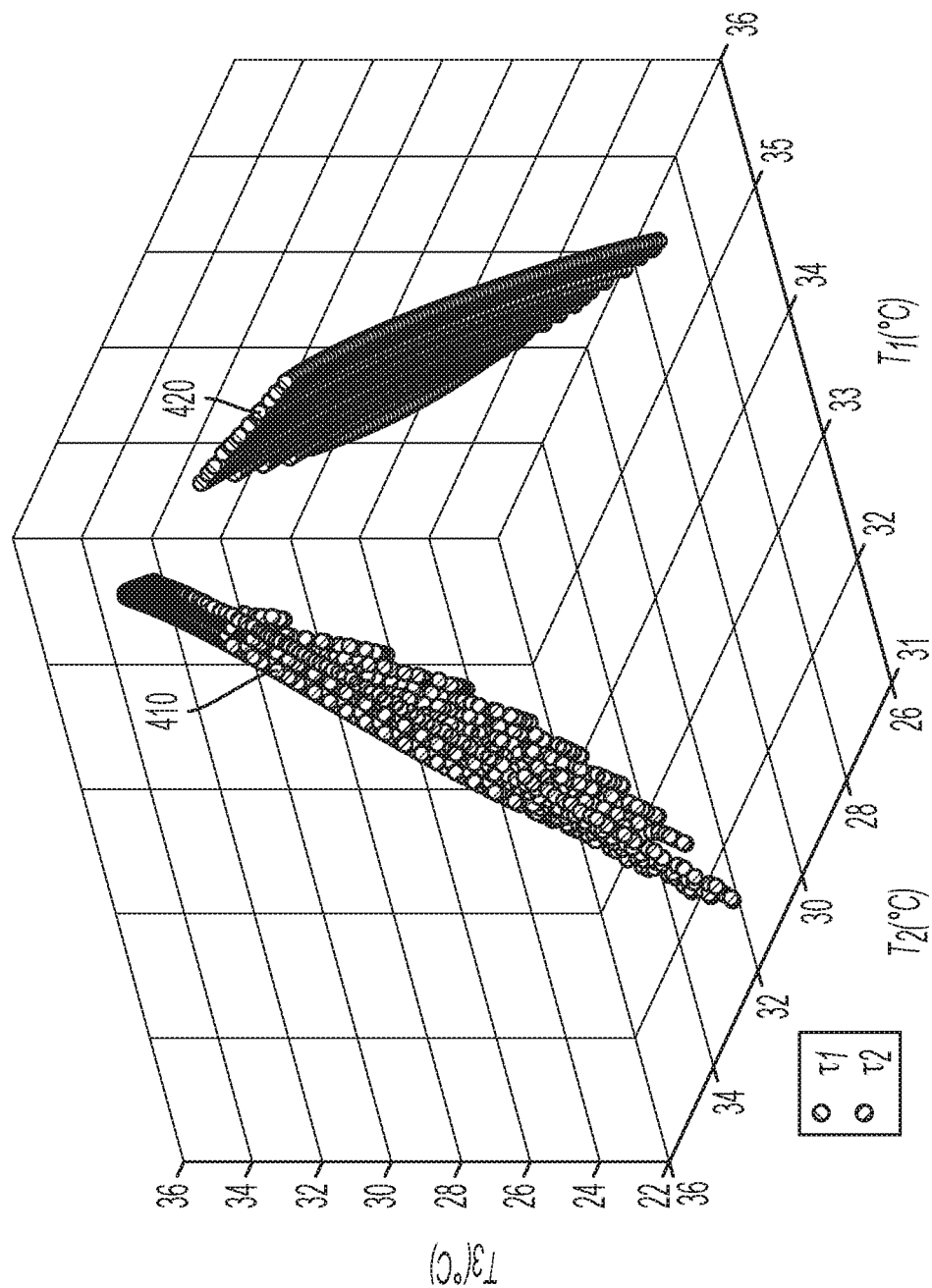
FIG. 4 depicts an example of a data-driven process to detect contamination of a transformer tank in accordance with embodiments described herein.

According to embodiments described herein, two complimentary approaches may be used to determined degradation of the transformer tank wall. These two approaches may be used alone or in combination with each other and/or in combination with any other process. First, a data driven approach is discussed. This involves clustering different sets of temperatures using an unsupervised clustering algorithm. This can be used to differentiate different degrees of degradation and/or contamination on the tank wall from one another. FIG. 4 depicts an example of such a process through simulation. Two different temperature distribution patterns 410, 420 are observed in the physics-based model simulation for different transformer conditions.

Figure 5:
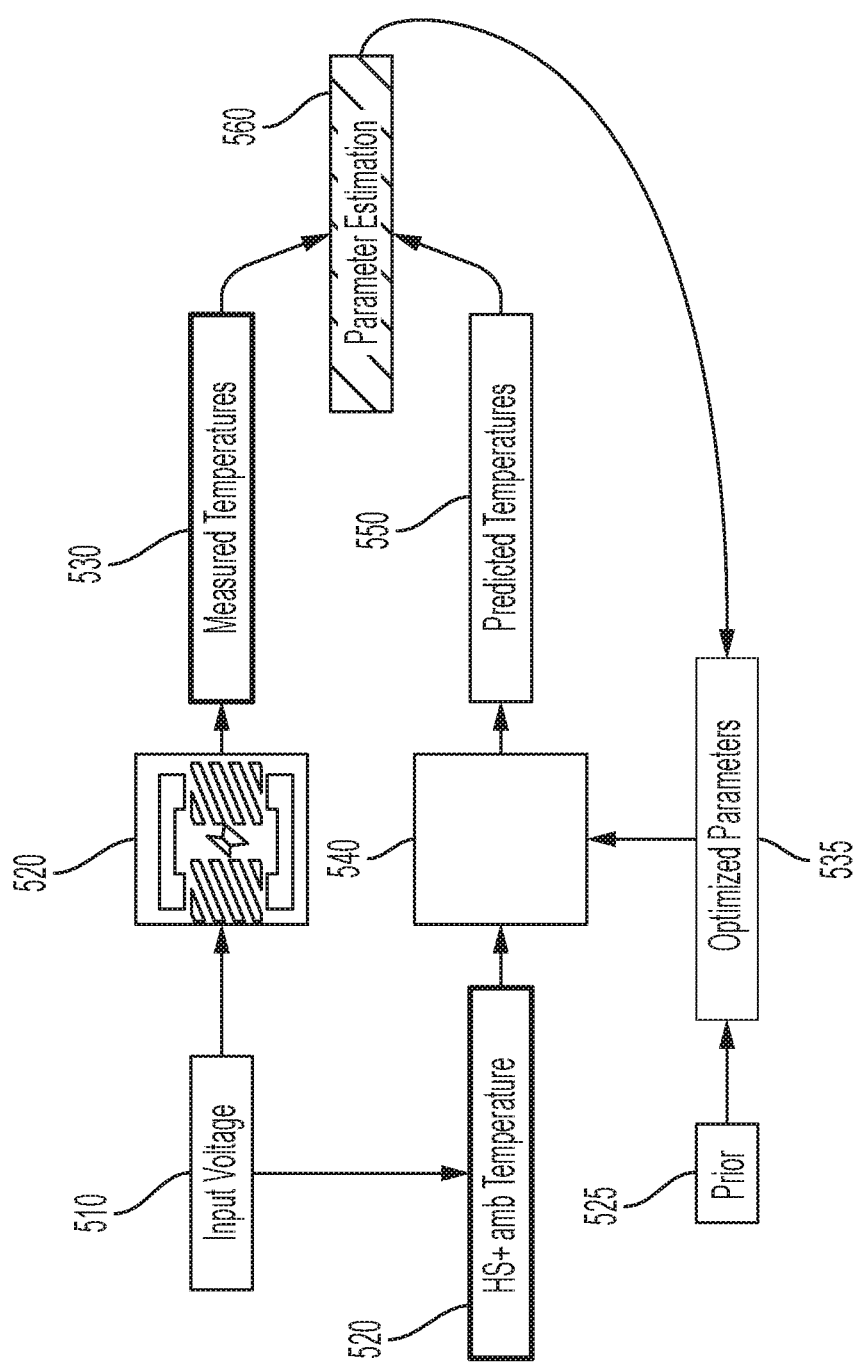
FIG. 5 illustrates a physics-based model to detect contamination of a transformer tank in accordance with embodiments described herein.

The second approach relates to calibrating a physics-based model in order to predict the amount of degradation in the tank wall from the measured temperatures. FIG. 5 illustrates an outline of a physics-based model in accordance with embodiments described herein. Here, the transformer can be excited under different conditions. An input voltage 510 is provided to a transformer 520 and a thermal response can be observed 530 using multiple sensing points in response to the transformer's loading conditions. Degradation and/or contamination on the surface of the transformer can be estimated by the parameters 535 from the physics-based model. For example, the model 540 may use ambient temperature and/or other conditions at the transformer 520 to estimate 560 the temperatures 550. The search space for the optimal parameters 535 may be very large. An iterative approach may be utilized to estimate the optimal parameters 535 using a Bayesian optimization technique. Input priors 525 represent knowledge about the transformer system including possible degradation scenarios. The priors 525 may represent the start point for exploration of optimal parameters 535. Residue between simulated data and real data may be used to update the parameters 535 used in the model using Bayesian inference. Once the optimal set of parameters 535 is found that could have generated the observed temperature patterns given different load conditions, the condition of the transformer (degradation/contamination) can be determined.

Figure 6:
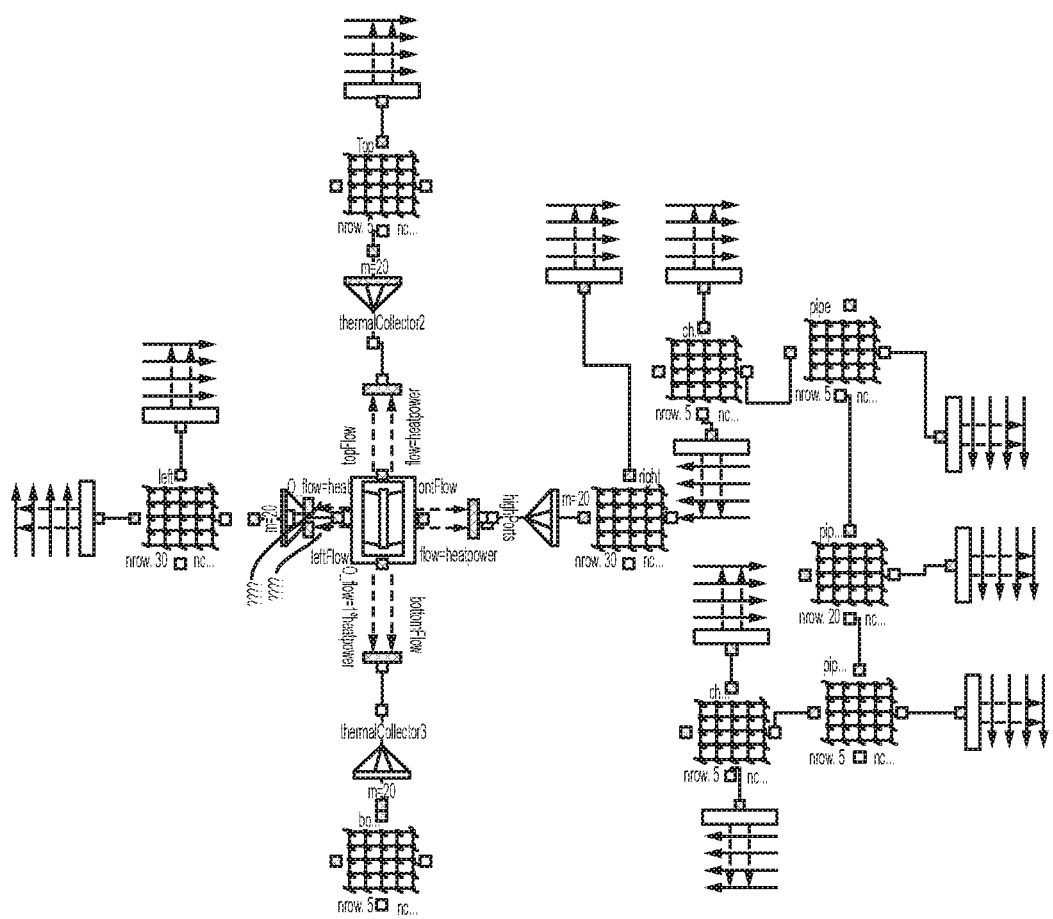
FIG. 6 illustrates a 2D heat transfer model of a transformer in accordance with embodiments described herein.

Heat generated from the transformer may first be dissipated through the cooling oil around the transformer cores, and eventually transferred into ambient air through a radiator. A 2D heat transfer model is implemented and demonstrated in FIG. 6. The cores of a transformer are treated as constant heat flux sources that depend on transformer load level. The heat dissipation process is modeled with a 2D heat transfer network. Uneven heating in the oil creates temperature change and thus density difference in the oil, which leads to fluid circulation that will increase heat transfer rate. One of the transformer system degradation symptoms is the accumulation of dirt or other debris around the outside case of the radiator. Heat conductivity and convective heat transfer coefficient of the radiator will impact the temperature distribution within the tank and radiator. The degree of system degradation is represented by change of thermal resistance in the radiator.

Figure 7:
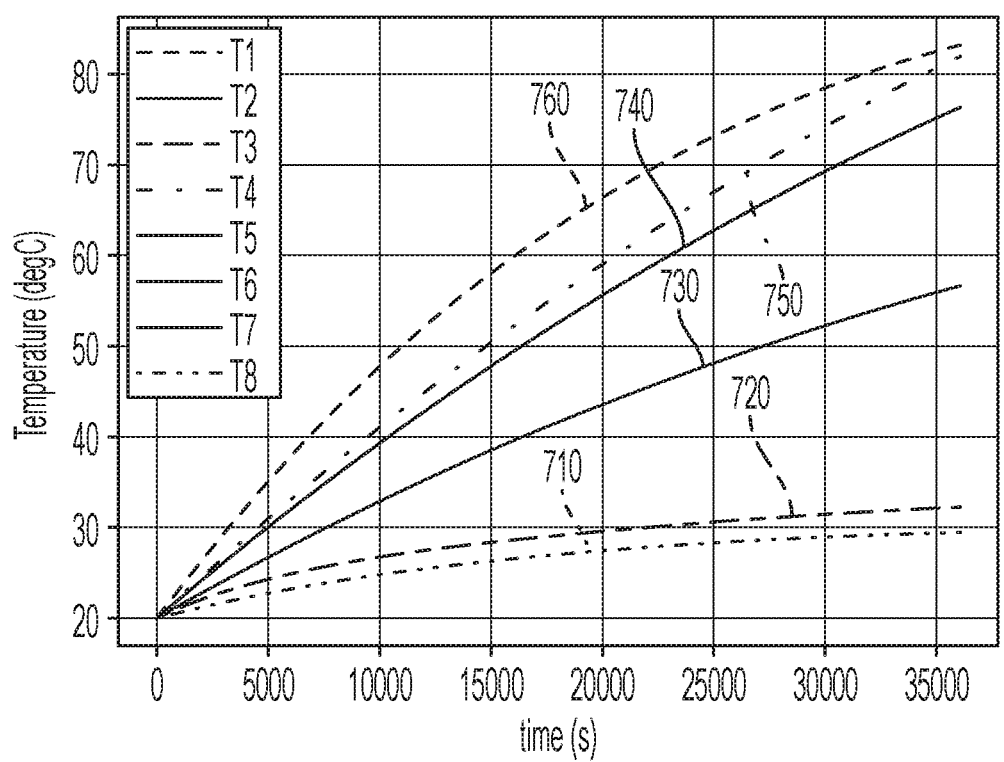
FIG. 7 shows the temperature history at various sensor locations of an oil-immersed transformer in accordance with embodiments described herein.
Figure 8A:
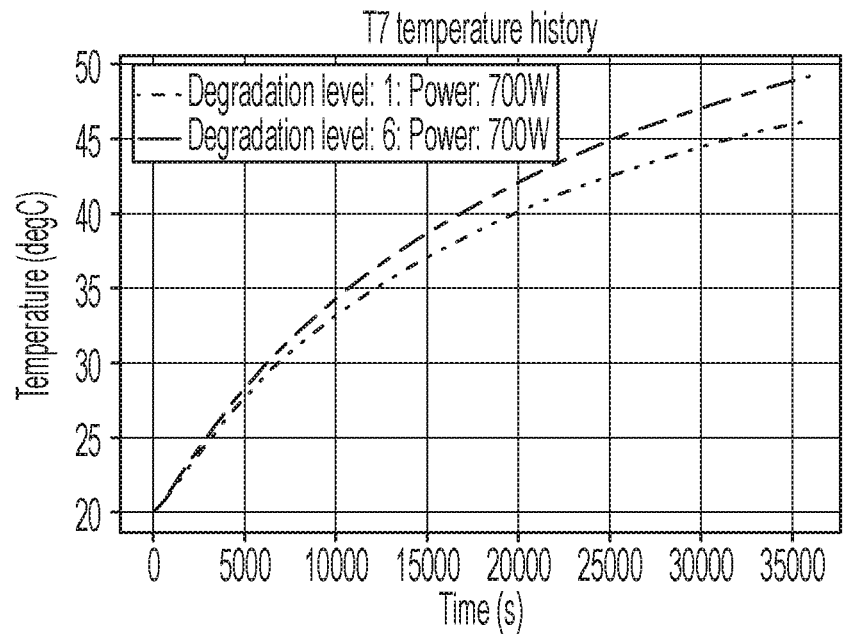
FIGS. 8A and 8B illustrate the temperature histories of two sensor locations at different degradation levels in accordance with embodiments described herein.
Figure 8B:
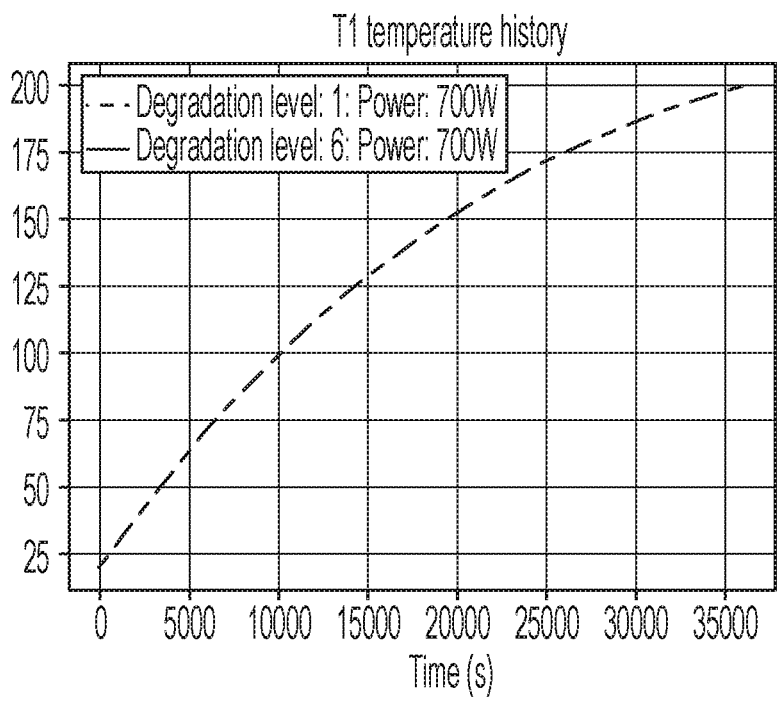

FIG. 7 shows the temperature history at various sensor locations 710, 720, 730, 740, 750, 760 of an oil-immersed transformer for the physics-based model simulation. The temperature rise patterns compare well with the FBG sensor measurements (FIG. 2). The impact of radiator surface quality (as an indicator of system degradation degree) on temperature trajectories is demonstrated in FIGS. 8A and 8B using the developed model. Heat generation from transformer cores are kept constant, while the convective coefficient of radiator surface decreases with increasing degradation level. System condition monitoring can be conducted that uses the difference in the temperature responses at various locations. Different temperature change patterns can be observed in FIGS. 8A and 8B. In FIG. 8A it shows that the oil temperature close to the radiator inlet is more sensitive to degradation level than other locations. FIG. 8B illustrates temperature in the air above oil level. As can be observed, T1 sees little change as the system degrades.

Figure 9:
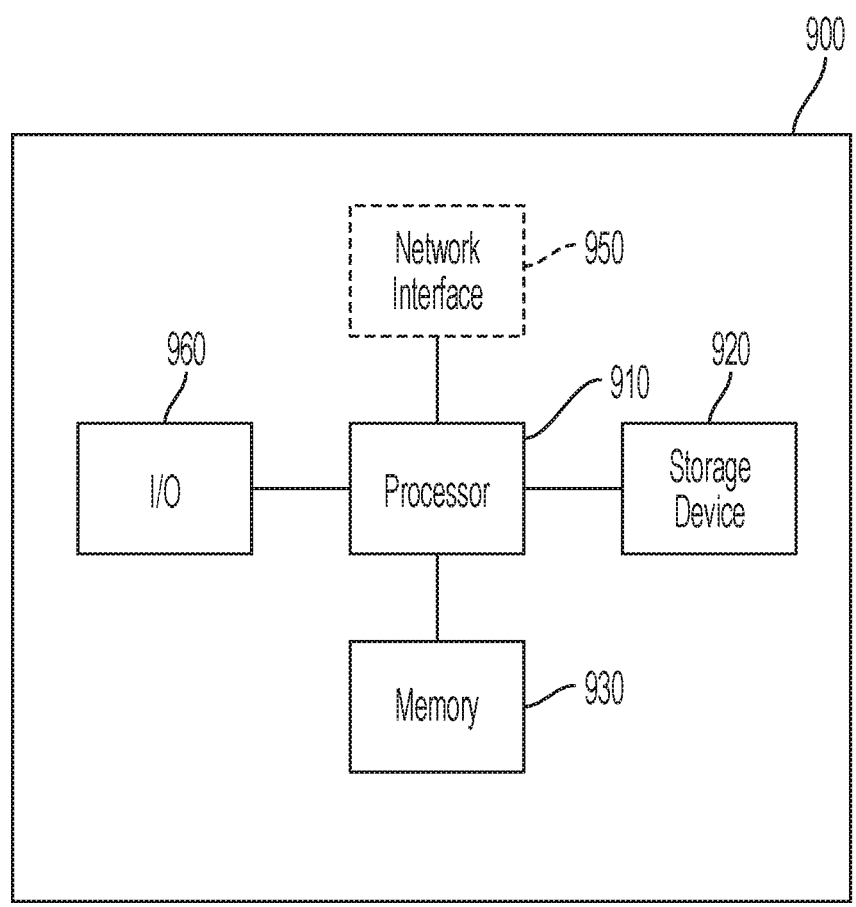
FIG. 9 shows a block diagram of a system capable of implementing embodiments described herein.

The above-described methods can be implemented on a computer using well-known computer processors, memory units, storage devices, computer software, and other components. A high-level block diagram of such a computer is illustrated in FIG. 9. Computer 900 contains a processor 910, which controls the overall operation of the computer 900 by executing computer program instructions which define such operation. It is to be understood that the processor 910 can include any type of device capable of executing instructions. For example, the processor 910 may include one or more of a central processing unit (CPU), a graphical processing unit (GPU), a field-programmable gate array (FPGA), and an application-specific integrated circuit (ASIC). The computer program instructions may be stored in a storage device 920 (e.g., magnetic disk) and loaded into memory 930 when execution of the computer program instructions is desired. Thus, the steps of the methods described herein may be defined by the computer program instructions stored in the memory 930 and controlled by the processor 910 executing the computer program instructions. According to embodiments described herein, the computer 900 may perform method steps as part of a server or cloud-based service. The computer 900 may include one or more network interfaces 950 for communicating with other devices via a network. The computer 900 also includes other input/output devices 960 that enable user interaction with the computer 900 (e.g., display, keyboard, mouse, speakers, buttons, etc. FIG. 9 is a high level representation of possible components of a computer for illustrative purposes and the computer may contain other components.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create computer-readable instructions/code for execution by a processor. Such instructions may be stored on a computer-readable medium and transferred to the processor for execution as is known in the art.

The foregoing description of the example embodiments have been presented for the purposes of illustration and description. It is not intended to be exhaustive or to limit the inventive concepts to the precise form disclosed. Many modifications and variations are possible in light of the above teachings. Any or all features of the disclosed embodiments can be applied individually or in any combination, not meant to be limiting but purely illustrative. It is intended that the scope be limited by the claims appended herein and not with the detailed description.

What is claimed is:

1. A monitoring system comprising:
   an array of optical sensors disposed within a transformer tank, each optical sensor configured to have an optical output that changes in response to a temperature within the transformer tank; and
   an analyzer coupled to the array of optical sensors, the analyzer configured to:
   determine a sensed temperature distribution based on the sensed temperatures;
   compare the sensed temperature distribution to an expected distribution; and
   detect exterior contamination of the transformer tank based on the comparison.

2. The monitoring system of claim 1, wherein at least one of the array of optical sensors comprises a fiber Bragg grating (FBG).

3. The monitoring system of claim 1, wherein each optical sensor of the array of optical sensors is configured to monitor the temperature within the transformer tank.

4. The monitoring system of claim 1, wherein the analyzer is configured to detect one or more of soiling, degradation, and debris on the transformer tank based on the comparison.

5. The monitoring system of claim 1, wherein the analyzer is configured to detect degradation of one or more transformer components other than the transformer tank.

6. The monitoring system of claim 1, wherein the analyzer is configured to detect corrosion of the transformer tank based on the comparison.

7. The monitoring system of claim 1, wherein the expected temperature distribution is determined based on a previously determined temperature distribution of the transformer tank.

8. The monitoring system of claim 7, wherein expected temperature distribution is determined based on a first determined temperature distribution of the transformer tank.

9. The monitoring system of claim 1, wherein each optical sensor of the array of optical sensors is disposed in a different location within the transformer tank.

10. The monitoring system of claim 1, wherein the analyzer is further configured to detect exterior contamination of the transformer tank based on the comparison using a clustering algorithm.

11. The monitoring system of claim 1, wherein the analyzer is further configured to:
    determine a set of parameter values that could have generated the determined temperature distribution; and
    detect exterior contamination of the transformer tank based on the comparison and the set of parameter values.

12. A method, comprising:
    sensing a plurality of temperature values using an array of optical sensors disposed within a transformer tank;
    determining a sensed temperature distribution based on the sensed temperatures; comparing the sensed temperature distribution to an expected distribution; and
    detecting exterior contamination of the transformer tank based on the comparison.

13. The method of claim 12, wherein sensing the plurality of temperature values comprises continuously sensing the plurality of temperature values within the transformer tank.

14. The method of claim 12, wherein detecting exterior contamination of the transformer tank comprises detecting one or more of soiling, degradation, and debris on the transformer tank based on the comparison.

15. The method of claim 12, wherein detecting exterior contamination of the transformer tank comprises detecting degradation of one or more transformer components other than the transformer tank.

16. The method of claim 12, wherein detecting exterior contamination of the transformer tank comprises detecting corrosion of the transformer tank based on the comparison.

17. The method of claim 12, wherein the expected temperature distribution is determined based on a previously determined temperature distribution of the transformer tank.

18. The method of claim 17, wherein expected temperature distribution is determined based on a first determined temperature distribution of the transformer tank.

19. The method of claim 12, further comprising detecting exterior contamination of the transformer tank based on the comparison using a clustering algorithm.

20. The method of claim 12, further comprising:
    determining a set of parameter values that could have generated the determined temperature distribution; and detecting exterior contamination of the transformer tank based on the comparison and the set of parameter values.

* * * * *